United States Patent
Randolph

(10) Patent No.: US 7,160,773 B2
(45) Date of Patent: Jan. 9, 2007

(54) METHODS AND APPARATUS FOR WORDLINE PROTECTION IN FLASH MEMORY DEVICES

(75) Inventor: Mark William Randolph, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/839,614

(22) Filed: May 5, 2004

(65) Prior Publication Data

US 2005/0250278 A1 Nov. 10, 2005

(51) Int. Cl.
H01L 21/336 (2006.01)

(52) U.S. Cl. ............................................ 438/257

(58) Field of Classification Search ................ 438/201, 438/211, 257, 288, 593; 257/E21.659, E21.68, 257/E21.685, E21.694
See application file for complete search history.

(56) References Cited

U.S. PATENT DOCUMENTS

| | | | |
|---|---|---|---|
| 4,554,729 A | | 11/1985 | Tanimura et al. |
| 4,994,403 A | * | 2/1991 | Gill ............................ 436/261 |
| 5,581,105 A | * | 12/1996 | Huang ......................... 257/369 |
| 5,768,186 A | * | 6/1998 | Ma ......................... 365/185.01 |
| 5,869,873 A | * | 2/1999 | Yu ............................... 257/362 |
| 5,909,347 A | * | 6/1999 | Yu ................................ 361/56 |
| 5,932,916 A | * | 8/1999 | Jung ........................... 257/355 |
| 5,995,354 A | * | 11/1999 | Yu ............................... 361/111 |
| 6,017,792 A | * | 1/2000 | Sharma et al. .............. 438/257 |
| 6,055,143 A | * | 4/2000 | Yu ................................ 361/56 |
| 6,127,705 A | * | 10/2000 | Kim ............................. 257/368 |
| 6,146,945 A | | 11/2000 | Osanai |
| 6,348,370 B1 | * | 2/2002 | Mehrad et al. .............. 438/210 |
| 6,380,031 B1 | * | 4/2002 | Mehrad et al. .............. 438/257 |
| 6,469,342 B1 | | 10/2002 | Kuo et al. |
| 6,479,348 B1 | | 11/2002 | Kamal et al. |
| 6,670,679 B1 | * | 12/2003 | Hirata ......................... 257/360 |
| 6,717,859 B1 | * | 4/2004 | Om'Mani et al. ...... 365/185.23 |
| 2004/0026732 A1 | | 2/2004 | Kuo et al. |
| 2004/0037147 A1 | | 2/2004 | Kuo et al. |

FOREIGN PATENT DOCUMENTS

JP 04025182 A 1/1992

OTHER PUBLICATIONS

International Search Report, Int'l Application No. PCT/US2005/004583, Int'l Filing Date Nov. 2, 2005, 3 pgs.

* cited by examiner

*Primary Examiner*—Lex H. Malsawma
(74) *Attorney, Agent, or Firm*—Eschweiler & Associates, LLC

(57) ABSTRACT

Methods and structures are presented for protecting flash memory wordlines and memory cells from process-related charging during fabrication. Undoped polysilicon is formed at the ends of doped polysilicon wordlines to create resistors through which process charges are discharged to a doped polysilicon discharge structure coupled with a substrate. The wordlines, resistors, and the discharge structure can be formed as a unitary patterned polysilicon structure, where the wordline and discharge portions are selectively doped to be conductive and the resistor portions are substantially undoped to provide a resistance high enough to allow normal cell operation after fabrication while providing a discharge path for process-related charging during fabrication.

18 Claims, 15 Drawing Sheets

METHODS AND APPARATUS FOR
WORDLINE PROTECTION IN FLASH
MEMORY DEVICES

FIELD OF INVENTION

The invention is generally related to the field of memory devices and more particularly to apparatus for flash memory wordline protection in a memory device and fabrication methods therefor.

BACKGROUND OF THE INVENTION

Flash and other types of electronic memory devices are constructed of memory cells that individually store and provide access to data. A typical memory cell stores a single binary piece of information referred to as a bit, which has one of two possible states. The cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells, where the data can then be retrieved in a read operation. In addition to programming and read operations, groups of cells in a memory device may be erased, wherein each cell in the group is programmed to a known state.

The individual memory cells typically comprise a semiconductor structure adapted for storing a bit of data. For instance, many conventional memory cells include a metal oxide semiconductor (MOS) device in which a binary piece of information may be retained. The erase, program, and read operations are commonly performed by application of appropriate voltages to certain terminals of the cell MOS device. In an erase or program operation the voltages are applied so as to cause a charge to be stored in the memory cell. In a read operation, appropriate voltages are applied to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access to other devices in a system in which the memory device is employed.

Flash memory is a non-volatile type of memory which can be rewritten and hold its content without power. Conventional flash memories are constructed in a cell structure wherein a single bit of information is stored in each flash memory cell. Each flash memory cell includes a transistor structure having a source, a drain, and a channel in a substrate or p-well, as well as a stacked gate structure overlying the channel. The stacked gate may include a gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a doped polysilicon control gate overlies the interpoly dielectric layer.

Multi-bit flash memory has recently been developed, in which each cell can store two or more data bits. Dual-bit memory cells are generally symmetrical, wherein the drain and source terminals are interchangeable. When appropriate voltages are applied to the gate, drain, and source terminals, one of the two bits may be accessed (e.g., for read, program, erase, verify, or other operations). When another set of terminal voltages are applied to the dual-bit cell, the other of the two bits may be accessed.

A typical flash memory cell may be programmed by applying a relatively high voltage to the gate and a moderately high voltage to the drain, in order to produce "hot" (high energy) electrons in the channel near the drain. The hot electrons accelerate across the tunnel oxide and into the floating gate (single bit) or across the oxide into the charge trapping regions such as a nitride (dual-bit), which become trapped in the floating gate or charge trapping layer, respectively. As a result of the trapped electrons, a threshold voltage of the memory cell increases. This change in the threshold voltage (and thereby the channel conductance) of the memory cell created by the trapped electrons is what causes the memory cell to be programmed. To read the memory cell, a predetermined gate voltage greater than the threshold voltage of an unprogrammed memory cell, but less than the threshold voltage of a programmed memory cell, is applied to the gate. If the memory cell conducts (e.g., a sensed current in the cell exceeds a minimum value), then the memory cell has not been programmed (the memory cell is therefore at a first logic state, e.g., a one "1"). If, however, the memory cell does not conduct (e.g., the current through the cell does not exceed a threshold value), then the memory cell has been programmed (the memory cell is therefore at a second logic state, e.g., a zero "0"). Thus, each memory cell may be read in order to determine whether it has been programmed, thereby identifying the logic state of the data in the memory cell.

Flash memory cells are organized into individually addressable units or groups such as bytes or words, which are accessed for read, program, or erase operations through address decoding circuitry, whereby such operations may be performed on the cells within a specific byte or word. The memory device includes appropriate decoding and group selection circuitry to address such bytes or words, as well as circuitry to provide voltages to the cells being operated on in order to achieve the desired operation. The flash memory cells, whether single bit or multiple-bit, may be interconnected in a variety of different configurations. For instance, cells may be configured in a NOR configuration, with the control gates of the cells in a row individually connected to a wordline and the drains of the cells in a particular column are connected together by a conductive bitline, while all the flash cells in the array have their source terminals coupled to a common source terminal, such as Vss or ground. In operation, individual flash cells in such a NOR configuration are addressed via the respective bitline and wordline using peripheral decoder and control circuitry for programming (writing), reading, erasing, or other functions.

Another cell configuration is known as a virtual ground architecture, in which the control gates of the core cells in a row are tied to a common wordline. A typical virtual ground architecture comprises rows of flash memory core cell pairs with a drain of one cell transistor coupled to an associated bitline and to the source of the adjacent core cell transistor. An individual flash cell is selected via the wordline and a pair of bitlines bounding the associated cell. A cell may be read by applying voltages to the control gate (e.g., via the common wordline) and to a bitline coupled to the drain, while the source is coupled to ground (Vss) via another bitline. A virtual ground is thus formed by selectively grounding the bitline associated with the source of the cells that are to be read. Where the core cells are of a dual-bit type, the above connections can be used to read a first bit of the cell, whereas the other bit may be similarly read by grounding the bitline connected to the drain, and applying a voltage to the source terminal via the other bitline.

In the course of manufacturing flash memory devices, certain processing steps involve the use of electrically charged plasma. For instance, ion implantation, plasma etching, plasma enhanced deposition processes and other charged processing operations may damage semiconductor wafers, and the flash memory cells therein. The plasma in such processes includes charged particles, some of which may accumulate on the wafer surface through antenna charging. For example, in back-end interconnect processing, inter layer dielectric (ILD) material is often deposited using plasma enhanced chemical vapor deposition (PECVD) and etched using plasma based reactive ion etching (RIE). In flash memory arrays, the conductive control gate structures are commonly formed as lines of doped polysilicon along rows of cells, which operate as wordlines to selectively access the rows of data stored therein. The polysilicon control gates or wordlines operate as antennas with respect to process-related charging, including process steps involving plasma. If unprotected, the wordline structures accumulate charge and acquire a voltage potential with respect to the wafer substrate, which can discharge through the stacked gate or charge trapping layer, leading to preprogramming of the cells or damage thereto.

Even after the doped polysilicon wordlines are covered with ILD material, process-related charging may cause cell damage. For instance, during back-end interconnect (e.g., metalization) processing, one or more patterned metal layers are formed over and between ILD layers, some of which are connected to the wordlines in the flash array. These metal wordline routing structures may themselves be directly exposed to back-end processes, and operate as charge gathering antennas, where charge accumulating on exposed wordline connections can discharge through the flash memory cells, again leading to damage and/or performance degradation. Diode protection devices may be coupled to the wordlines during interconnect processing, but such techniques provide no wordline protection prior to formation of the second metalization level or layer. Accordingly, improved wordline protection apparatus and methods are desirable for the manufacture of flash memory devices to inhibit the adverse effects of process-related charging.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later. The invention relates to flash memory devices and protecting memory array wordlines and memory cells from process-related charging during fabrication.

One aspect of the invention provides a wordline protection apparatus for protecting a wordline structure in a flash memory array, comprising a polysilicon resistor structure coupled with a wordline structure, and a polysilicon discharge structure coupled between the polysilicon resistor structure and a substrate. The apparatus may further comprise a thin dielectric extending between the polysilicon discharge structure and the substrate, for example, where the thin dielectric is less than or equal to about half the thickness of a dielectric layer in cells of the flash memory array. Alternatively or in combination with the thin dielectric, the apparatus may further comprise a conductive discharge routing structure electrically coupled between the polysilicon discharge structure and the substrate.

Another aspect of the invention provides a wordline structure for a flash memory array, comprising a polysilicon structure having a discharge portion and one or more wordline and resistor portions, as well as a coupling structure coupling the discharge portion to the substrate. The wordline portions may comprise doped polysilicon and individually form a plurality of control gates for memory cells along rows in a memory array. The discharge portion is spaced from the wordline portions, and may also comprise doped polysilicon. The resistor portions individually extend between the discharge portion and one of the wordline portions, wherein the resistor portions are substantially undoped polysilicon to provide an impedance between the discharge and wordline portions, wherein the polysilicon structure may be a unitary structure patterned from a deposited polysilicon layer.

Yet another aspect of the invention provides a method of fabricating a wordline structure for a flash memory cell. The method comprises forming a conductive wordline structure and forming a resistor between the conductive wordline structure and a substrate, wherein the conductive wordline structure and the resistor may be formed concurrently and prior to interconnect processing. The wordline and resistor may be formed by depositing a polysilicon layer, patterning the polysilicon layer to define a polysilicon wordline portion and a polysilicon resistor portion connected to the polysilicon wordline portion, and then selectively doping the polysilicon wordline portion with the resistor portion masked to remain substantially undoped. A discharge structure may be created, such as doped polysilicon, to couple the undoped resistor portion to the substrate through a thin dielectric and/or via a subsequently formed conductive interconnect routing structure (e.g., metal) that directly connects the discharge structure to the substrate.

Still another aspect of the invention provides a method of protecting wordline structures in a flash memory array, comprising forming a plurality of polysilicon resistor structures individually coupled with a plurality of conductive wordlines in a memory array, and coupling the plurality of polysilicon resistor structures to a substrate. The resistor structures may be formed by depositing a layer of polysilicon, and patterning the polysilicon layer to define a plurality of polysilicon wordline portions, a polysilicon discharge portion spaced from the polysilicon wordline portions, and a plurality of polysilicon resistor portions individually extending between the polysilicon discharge portion and the plurality of polysilicon wordline portions. The polysilicon discharge portion and the plurality of polysilicon wordline portions are then doped to render these conductive, while the resistor portions remain substantially undoped. The resistor portions may be coupled to the substrate by forming the discharge portion or structure over a thin dielectric above the substrate and/or by connecting the discharge structure to the substrate through interconnect routing structures.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
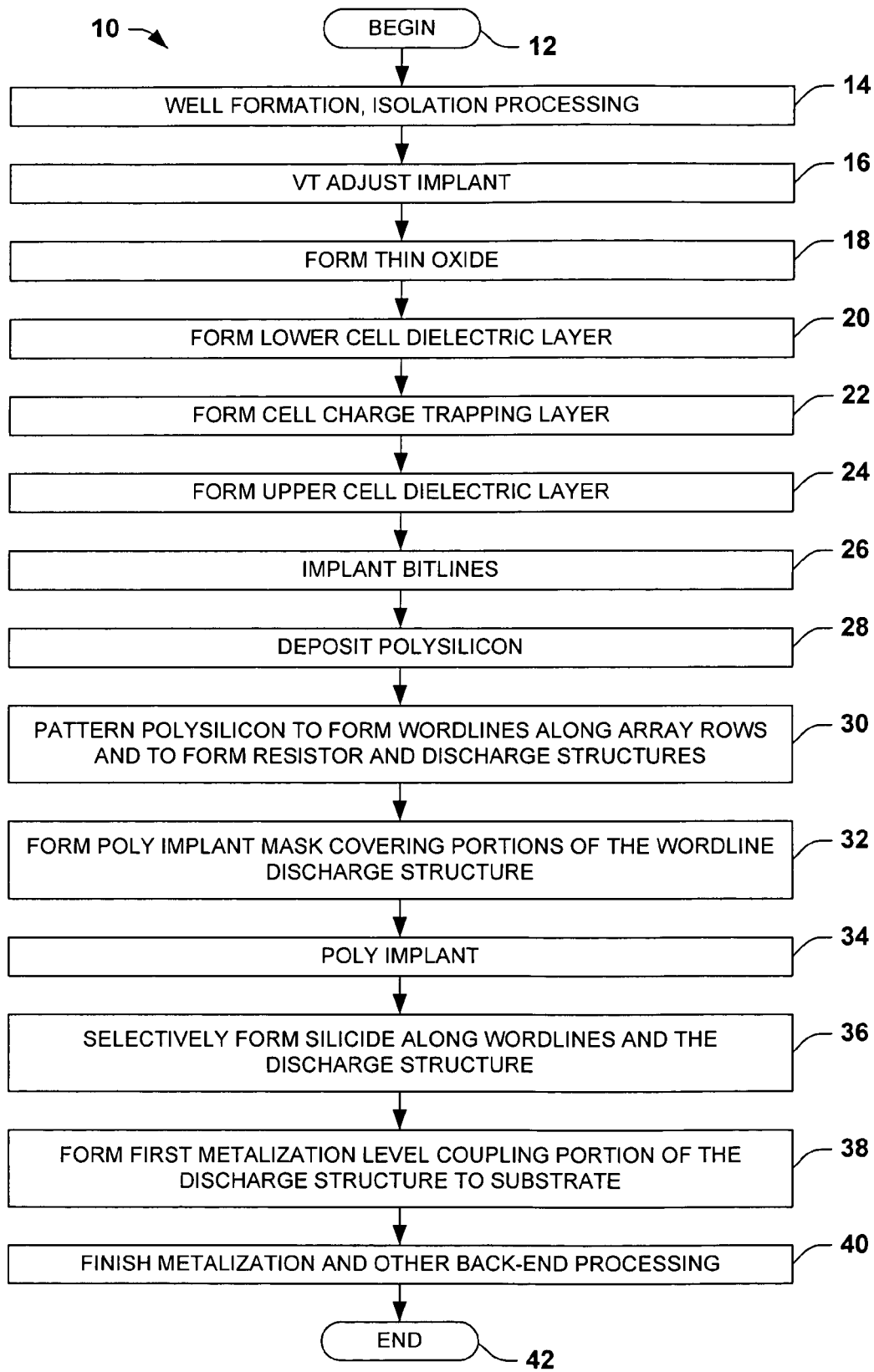
FIG. 1 is a flow diagram illustrating an exemplary method of fabricating wordline structures in flash memory devices in accordance with the present invention.

One or more implementations of the present invention will now be described with reference to the drawings, wherein like reference numerals are used to refer to like elements throughout. One or more aspects of the invention are hereinafter illustrated and described in the context of an exemplary dual-bit flash memory device in which conductive n-doped polysilicon wordlines are formed above a charge trapping layer or floating gate to create flash memory cells in combination with n-doped bitline portions (e.g., source/drains) in an underlying p-type silicon substrate, with the cells organized along rows (e.g., wordlines) and columns (e.g., bitlines) in a virtual ground array. However, the invention is not limited to the illustrated implementations and may alternatively be employed in connection with any specific type of substrate materials (e.g., silicon wafer, SOI wafer, epitaxial layer, etc.), any type of flash memory cell structure (e.g., floating gate, oxide-nitride-oxide (ONO), SONOS, etc.), and any array configuration (e.g., NOR, virtual ground, etc.).

An exemplary method 10 is hereinafter illustrated and described with respect to FIG. 1 and an exemplary flash memory device 100 is illustrated and described below in FIGS. 2–11E, wherein the illustrated devices and structures are not necessarily drawn to scale. Although the exemplary method 10 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the fabrication and/or processing of flash memory devices illustrated and described herein as well as in association with other structures and devices not illustrated.

Beginning with a silicon substrate or other semiconductor body at 12, wells and isolation structures (e.g., STI or field oxide) are formed at 14 and one or more threshold voltage (Vt) implants are performed at 16, wherein a dummy gate oxide may be formed prior to the Vt implants at 18 and removed thereafter. The Vt adjust implants at 14 operate to set a threshold voltage of the subsequently fabricated flash memory cells in a core memory array portion of the wafer and may also be used to set the threshold voltage of transistors formed elsewhere in the device. A thin oxide is formed over the substrate at 18, through deposition, thermal oxidation, or other suitable technique, having a thickness about half the thickness of a subsequently formed dielectric layer in cells of the flash memory array or less. The thin dielectric, such as $SiO_2$ or other suitable dielectric material is formed over the substrate in a core memory array portion of the device. The thin dielectric may be concurrently formed over the substrate at 18 in other active regions of the device wafer, for example, to operate as a gate oxide in logic transistors or other circuitry. In the memory array portion of the wafer, all or a portion of a conductive discharge structure can be subsequently formed over the thin dielectric to provide an electrical discharge path from flash memory wordlines to the substrate for process-related charging.

At 20–24 three layers are deposited for use in forming a charge trapping structure for the flash memory cells. In the illustrated example, a lower cell dielectric or insulating layer is formed over the substrate at 20 via any suitable deposition or thermal oxidation process, for example, such as $SiO_2$ or other suitable material formed to any thickness, such as about 70 Å or less in one possible implementation. At 22, a cell charge trapping layer is deposited, for example, a silicon nitride (e.g., $Si_3N_4$, etc.) to any suitable thickness, such as about 60 to 80 Å in one example. The charge trapping nitride can be deposited at 22 using any suitable deposition processes within the scope of the present invention. An upper cell dielectric or insulating layer is deposited at 24 over the charge trapping nitride, where the upper dielectric may be any suitable material, such as $SiO_2$ formed to a thickness of about 70 Å or less in one implementation. In this example, the thin oxide dielectric formed at 18 has a thickness of about 35 Å or less. In general, the thin oxide and the first dielectric of the charge trapping structure may be different materials, wherein the thin dielectric at 18 is preferably half the equivalent electrical thickness of the charge trapping structure dielectric layers. The oxide-nitride-oxide configuration is commonly referred to as an ONO layer for convenience. Alternatively, other types of charge trapping layers or floating gates may be employed in fabricating flash memory cells within the scope of the present invention. Portions of the three charge trapping structure layers may be removed in areas outside the core memory portion of the wafer, for example, using selective etching techniques. Further, where the thin dielectric (e.g., deposited at 18 above) is used to couple the subsequent discharge structure to the substrate, the three charge trapping structure layers may be removed from a portion of the wafer designated for such coupling.

At 26, bitlines are selectively implanted along columns of the prospective memory array. In one example, a mask is formed over the ONO layers using suitable photolithographic or other suitable techniques, which exposes regions of the ONO layers under which the bitlines are to be formed. Dopants are then implanted through the exposed portions and into the underlying substrate to form source/drain regions leaving channel regions of the substrate therebetween. In one example, the substrate is lightly p-doped silicon, wherein the bitline implantation at 26 provides one or more n-type dopants (e.g., arsenic, phosphorous, antimony, etc.) to form the bitline and source/drain regions. Other dopant types (e.g., n or p-type), compositions, and/or concentrations can alternatively be used to form the bitlines at 26 within the scope of the invention, after which the bitline implantation mask is removed. In one possible alternative, the bitline implantation at 26 can be performed prior to formation of some or all of the tri-layer charge trapping materials, for example, prior to deposition of the upper dielectric at 24.

At 28–34, a polysilicon structure is formed and selectively implanted to provide conductive wordlines and protection apparatus for mitigating the adverse effects of process-related charging in accordance with an aspect of the invention. A layer of polysilicon is deposited or otherwise formed over the ONO layers at 28. Any suitable deposition processes may be employed and the polysilicon may be formed to any suitable thickness at 30 within the scope of the invention. At 30, the polysilicon is patterned to define polysilicon wordline portions, polysilicon resistor portions, and a polysilicon discharge portion, where the wordline portions are formed over the floating gate or charge trapping material, the discharge portion is spaced from the polysilicon wordline portion, and the resistor portions are disposed between the wordline portions and the discharge portion. One possible example is illustrated and further described below with respect to FIGS. 7A–7E. Any suitable patterning techniques may be employed to define the polysilicon structure at 30 within the scope of the invention, such as masking and reactive ion etching (RIE) to remove select portions of the polysilicon, wherein the etching may, but need not, remove some or all of the ONO material layers between adjacent patterned wordline portions.

The formation and patterning of the polysilicon at 28 and 30 may be concurrently used to form polysilicon transistor gate structures in transistors outside the memory array area of the wafer. In the exemplary implementation, the patterned polysilicon wordline portions extend generally perpendicular to the bitline direction along rows of the prospective flash memory array, with the resistor portions extending outward from an end of the wordline portions and the discharge portion extending along the column direction to couple with the outer ends of the resistor portions. However, other relative orientations are possible and are contemplated as falling within the scope of the invention.

At 32 an implant mask is formed, for example, using any suitable photolithographic masking techniques, to cover select portions of the patterned polysilicon structure (e.g., the prospective resistor portions), leaving the wordline and discharge portions exposed (e.g., FIGS. 8A–8F below). An ion implantation is performed at 34 to selectively provide dopants to the exposed portions of the polysilicon structure, using any suitable dopant type (e.g., n or p-type), concentrations, implantation energy, etc., which renders all or parts of the exposed polysilicon wordline and discharge portions conductive before the implantation mask is removed. Because the resistor portions of the patterned polysilicon structure are covered during the implantation at 34, these remain substantially undoped and hence resistive (compared to the wordline and discharge portions), wherein an example of the selectively implanted polysilicon structure is illustrated below in FIGS. 9A–9F. The mask formed at 32 may also include openings exposing gate structures and source/drain regions of the substrate in logic areas of the wafer, wherein the implantation at 34 may concurrently operate as a source/drain or drain extension (e.g., LDD) implant for logic transistors. In this regard, the selective doping of the patterned polysilicon structure of the invention adds no additional masks or processing steps to a fabrication process flow.

At 36, silicide processing is performed to form conductive metal silicide along the tops of the wordline and discharge portions of the patterned polysilicon structure without siliciding the resistor portions thereof (e.g., FIGS. 10A–10F below). The silicide processing at 36 can include any process steps and materials within the scope of the invention, and may concurrently operate to form silicide contacts for polysilicon transistor gates and silicon source/drains in logic areas of the device wafer. In one example, a silicon nitride silicide structure is formed at 36 over portions of the wafer in which no silicide is desired, including the resistor portions of the polysilicon structure of the invention. Nickel, cobalt or other suitable metal is then deposited and a thermal annealing process is performed to react the deposited metal with the underlying polysilicon of the discharge and wordline portions. This reaction forms a metal silicide over the conductive wordline and discharge portions, but not over the polysilicon resistor portions, after which any unreacted metal and the silicon nitride silicide are removed.

This leaves a polysilicon structure including doped polysilicon wordlines coupled to the doped polysilicon discharge structure through the substantially undoped polysilicon resistors. In a preferred implementation, the resistor portions provide an electrical resistance of about 1 Mohms or more to allow wordline signals on the conductive wordline portions to properly activate the memory cells during operation. The resistor portions also operate to provide a discharge path for currents resulting from process-related charging during fabrication. In this regard, the coupling of the conductive discharge portion of the polysilicon structure through the thin dielectric to the substrate provides a discharge path for process-related charging prior to interconnect (e.g., metalization) processing. In another possible implementation, the polysilicon can be selectively implanted at 32, 34 prior to patterning at 30, such that discharge protection is provided during reactive ion etching at 30. Thus, whereas conventional diode coupling techniques do not provide any protection before metalization, the present invention protects the wordline structures and the charge trapping layers from process-related charging currents prior to, as well as during and after interconnect processing.

At 38, a first interconnect or metalization level is constructed, including a conductive metal interconnect routing structure coupled between the discharge portion and the substrate. This may be constructed by forming first and second tungsten contacts through via holes in a first interlayer dielectric (ILD) to connect with the substrate and with the discharge portion silicide, followed by formation of a copper or aluminum routing structure that couples the first and second tungsten contacts, thus forming a direct electrical connection from the discharge portion to the substrate. This metal layer routing connection provides an improved discharge path from the doped polysilicon discharge portion to the substrate in addition to that provided through the thin dielectric. Other implementations are possible wherein the discharge portion is coupled to the substrate through the interconnect routing structure and/or the thin dielectric, alone or in combination, wherein all such variations are contemplated as falling within the scope of the invention. At 40, further metalization and other back-end processing are performed before the method 10 ends at 42.

Figure 2:
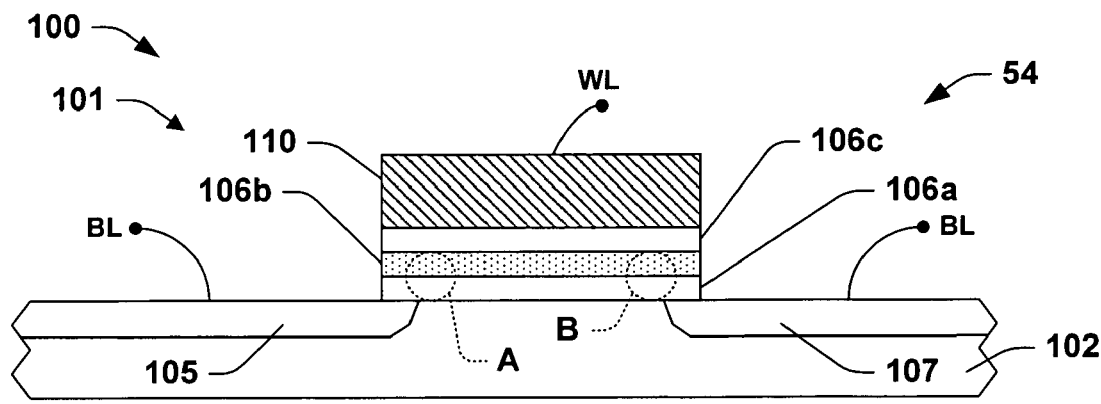
FIG. 2 is a partial side elevation view in section illustrating an exemplary flash memory cell in association with which the various aspects of the invention may be employed.

An exemplary memory device 100 is illustrated and described hereinafter with respect to FIGS. 2–11E, where the device 100 can be a dedicated memory device or other type of semiconductor device (e.g., microprocessor, logic device, etc.) in which a flash memory array 54 is included. FIG. 2 illustrates an exemplary dual-bit flash memory cell 101 of the device 100 in association with which one or more of the various aspects of the invention may be carried out.

The memory cell 101 comprises, for example, a silicon nitride layer 106b that may have buried polysilicon islands (not shown) therein. A p-type silicon substrate 102 has buried n+ source 105 and n+ drain 107 regions that operate as bitlines in the array 54. The silicon nitride 106b is sandwiched between two SiO$_2$ layers 106a and 106c. Alternatively, the layer 106b may comprise any other form of charge trapping layer, including single or multiple material layers.

Overlying the oxide layer 106c is a doped polysilicon control gate 110 that extends along an array row to other cells (not shown) to form a conductive wordline. The control gate 110 is doped with one more n-type impurities (e.g., phosphorus, arsenic, antimony, etc.) thereby rendering the wordline/control gate 110 conductive. The exemplary memory cell 101 is capable of storing two binary data bits, including a left bit represented by the dashed circle A and a right bit represented by the dashed circle B in FIG. 2. The dual-bit memory cell 101 is generally symmetrical, wherein the drain 107 and the source 105 are interchangeable. In this regard, the left bitline 105 may serve as the source terminal and the right bitline 107 as the drain terminal with respect to the right bit B. Likewise, the right bitline 107 may serve as the source terminal and the left bitline 105 as the drain terminal for the left bit A. The present invention may be implemented in association with various types of single or multi-bit memory cell types, including the cell 101 of FIG. 2 as well as others not illustrated. In addition, the invention is applicable to such dual-bit memory devices wherein both bits (e.g., bits A and B of cell 101) are used for data or information storage, as well as those in which only one bit (e.g., bit A of cell 101) of the dual-bit cell is so used.

Figure 3:
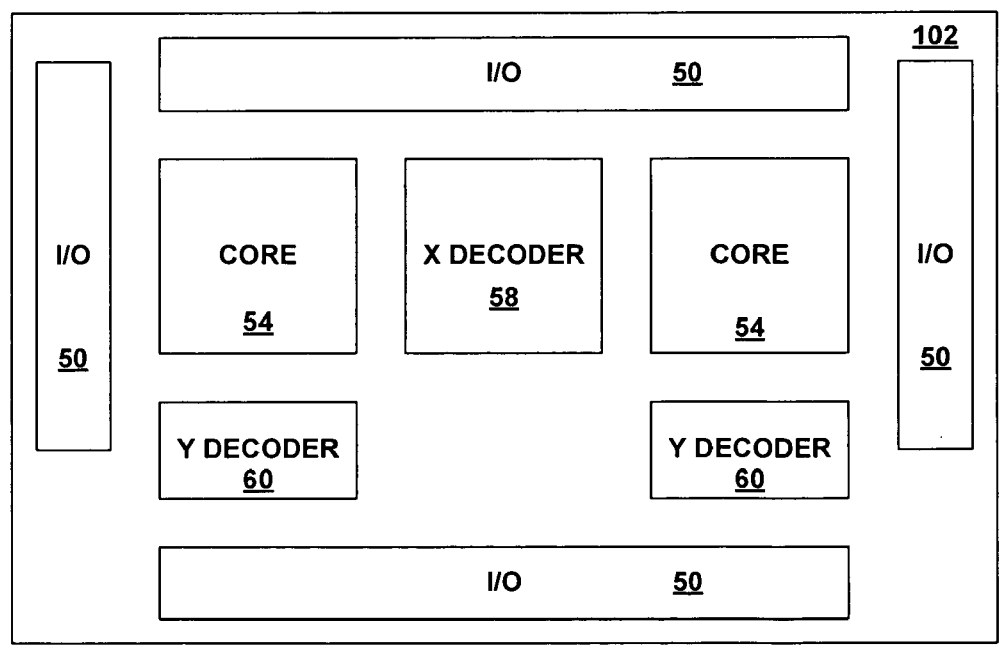
FIG. 3 is a simplified top plan view of a flash memory device in which one or more aspects of the invention may be carried out.

FIG. 3 illustrates a schematic top plan view of an exemplary dedicated memory device 100, comprising a semiconductor substrate 102 in which one or more high-density core regions and one or more low-density peripheral portions are formed. The core regions comprise one or more M×N array cores 54 of individually addressable, substantially identical dual-bit flash memory cells 101, as illustrated in FIG. 1. The peripheral portions comprise I/O circuitry 50 and programming or decoder circuitry 58, 60 for selectively addressing the individual memory cells 101. The programming circuitry comprises one or more x-direction (e.g., column) decoders 58 and y-direction (e.g., row) decoders 60, which, together with the I/O circuitry 50, connect the source, gate, and drain (e.g., wordlines and bitlines) of selected addressed memory cells 101 to predetermined voltages or impedances during program, erase, and read operations. In this regard, the decoder and I/O circuitry provide the necessary wordline and bitline control signals during memory access operations, and buffer the incoming and outgoing data associated therewith, wherein the circuits 50, 58, and 60 may be fashioned from any suitable logic circuits and devices within the scope of the invention.

Figure 4:
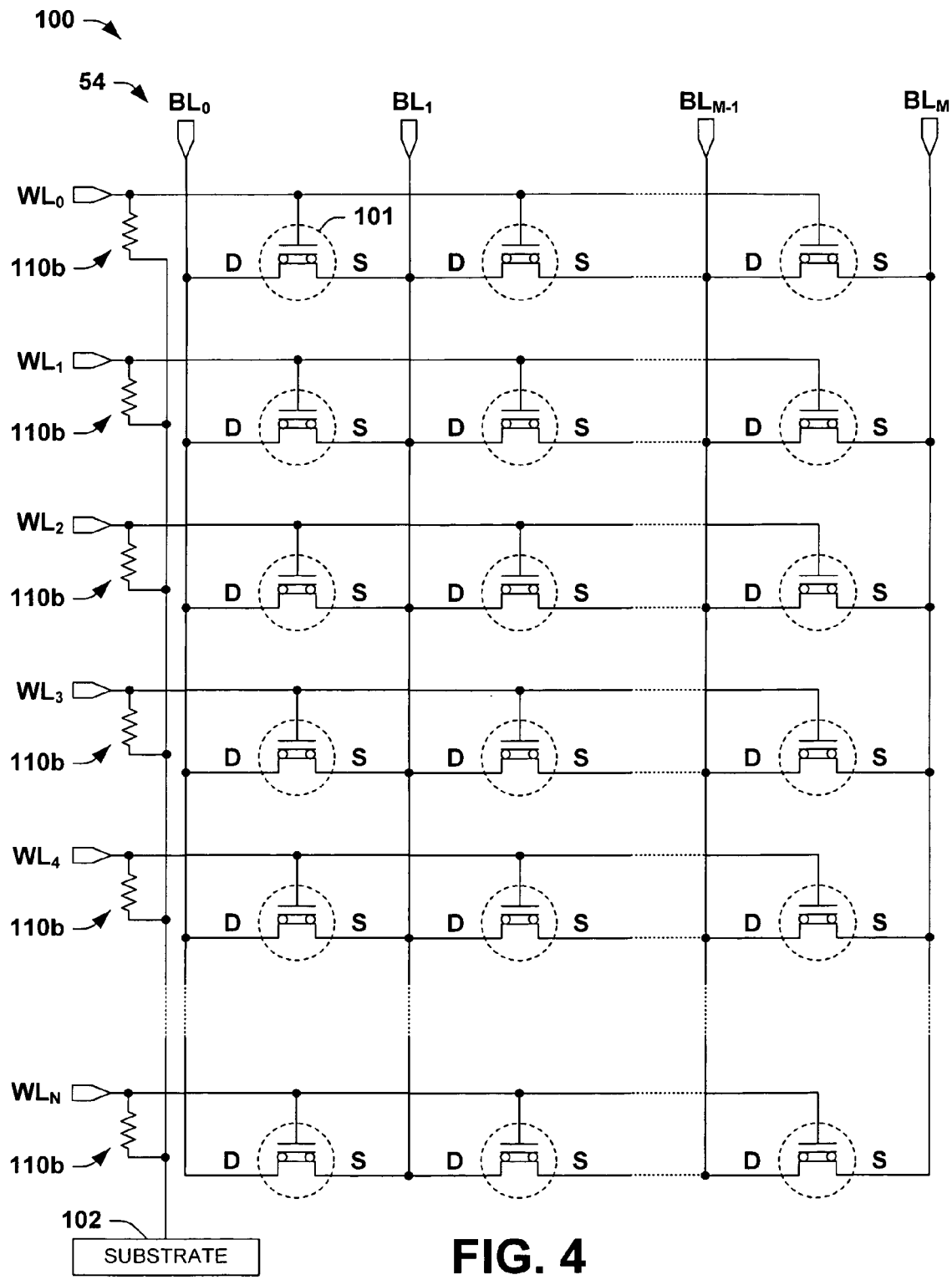
FIG. 4 is a schematic diagram illustrating a portion of a flash memory array in the device of FIGS. 2 and 3, including wordline protection apparatus in accordance with the invention.

FIG. 4 illustrates a portion of one of the core arrays 54 in the device 100, wherein portions of several rows and columns of cells 101 are illustrated along wordlines WL$_0$ through WL$_N$ and bitlines BL$_0$ through BL$_M$, respectively, where the array 54 is illustrated in a virtual ground configuration in this example. The array 54 comprises rows of flash cells 101 with control gate terminals coupled to an associated wordline WL, and with columns of cells 101 having a drain of one cell 101 coupled to an associated bitline BL together with the source of an adjacent cell 101. In this configuration, the drain terminals of the cells 101 within a given column are connected to the same bitline BL. Individual flash cells 101 may be selected via a corresponding wordline WL and a pair of bitlines BL bounding the target cell 101, wherein the wordline and bitline signals are generated by the decoder circuitry 58 (FIG. 3). Thus, when a positive voltage is applied to the bitline BL coupled to the drain of a cell 101, a conductive path is established between the drain and the source thereof, which is coupled to ground by provision of the appropriate bitline signals from the decoders 58. In this manner, a virtual ground is formed by selectively connecting a ground to the bit line associated with the source terminal of only those selected flash cells which are to be programmed or read. In accordance with the invention, resistors 110b are provided between the wordlines WL and the device substrate 102 to protect the cells 101 against process-related charging, as described further below.

Figure 5A:
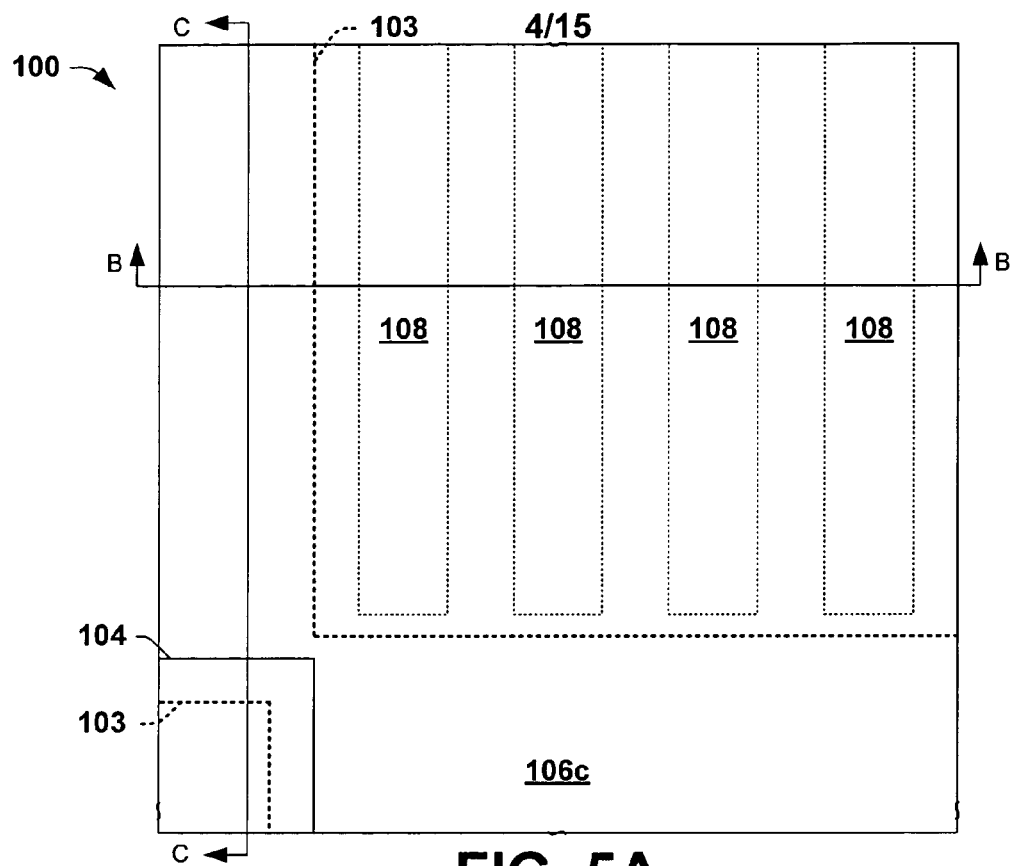
FIGS. 5A through 11E are partial top plan and side elevation views in section illustrating the exemplary flash memory device at various stages of fabrication in accordance with the invention.

FIGS. 5A–11E provide top plan views and side elevation views in section illustrating a portion of the core array 54 of the device 100 undergoing fabrication processing in which a protection apparatus is formed to protect wordlines and flash cells 101 from process-related charging in accordance with the invention. In FIGS. 5A, 6A, 7A, . . . , 11A, top plan views are illustrated along with section lines indicating the sectional side elevation views associated with the other figures. For example, FIG. 5B is a side elevation view in section taken along line B—B of FIG. 5A and FIG. 5C is a side elevation view in section taken along line C—C of FIG. 5A. As illustrated, the device 100 is fabricated generally in accordance with the exemplary method 10 discussed above. However, devices and apparatus may be fashioned according to other fabrication processes and techniques within the scope of the invention.

Figure 5B:
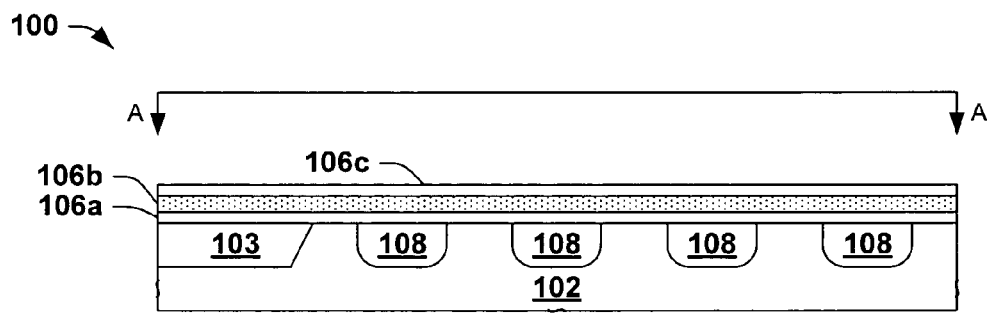
Figure 5C:
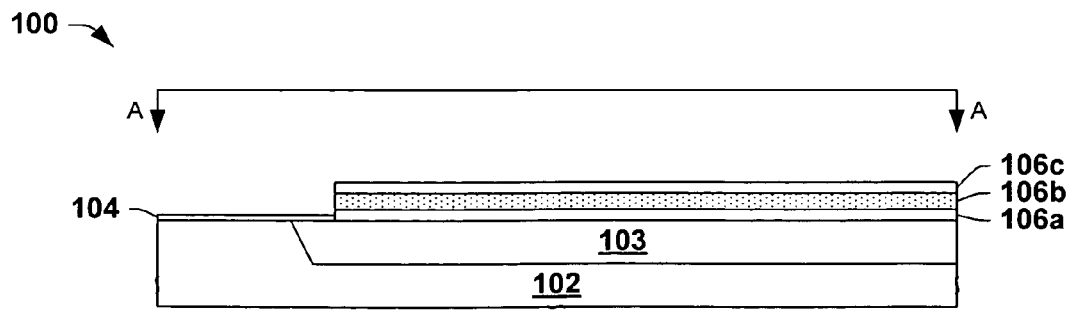

FIGS. 5A–5C illustrate the device 100 comprising a p-doped silicon substrate 102 following formation of wells (not shown) and isolation structures 103, and after any Vt adjust implants have been performed. A thin SiO$_2$ oxide or other dielectric 104 is formed over the substrate 102, having an equivalent electrical thickness about half that of a charge trapping dielectric layer 106a or less. In the exemplary device 100, the thin dielectric is SiO$_2$ with a thickness of about 35 Å or less. Charge trapping material layers 106a–106c are disposed above a portion of the substrate 102, where the layers 106 may overlie the thin dielectric 104, or the first layer 106a may be alternatively formed directly over the substrate 102. As illustrated in FIGS. 5A and 5C, portions of the layers 106a–106c are removed from a portion of the wafer, leaving only the thin dielectric 104 above the substrate 102. In the exemplary device 100, the lower layer 106a is SiO$_2$ or other suitable material formed to about 70 Å, the charge trapping material layer 106b is Si$_3$N$_4$ formed to a thickness of about 60 to 80 Å, and the upper dielectric layer 106c is SiO$_2$ having a thickness of about 70 Å. N-doped bitlines 108 are formed through selective implantation (e.g., arsenic, phosphorous, antimony, etc.) along columns of the prospective memory array 54 in the substrate 102.

Figure 6A:
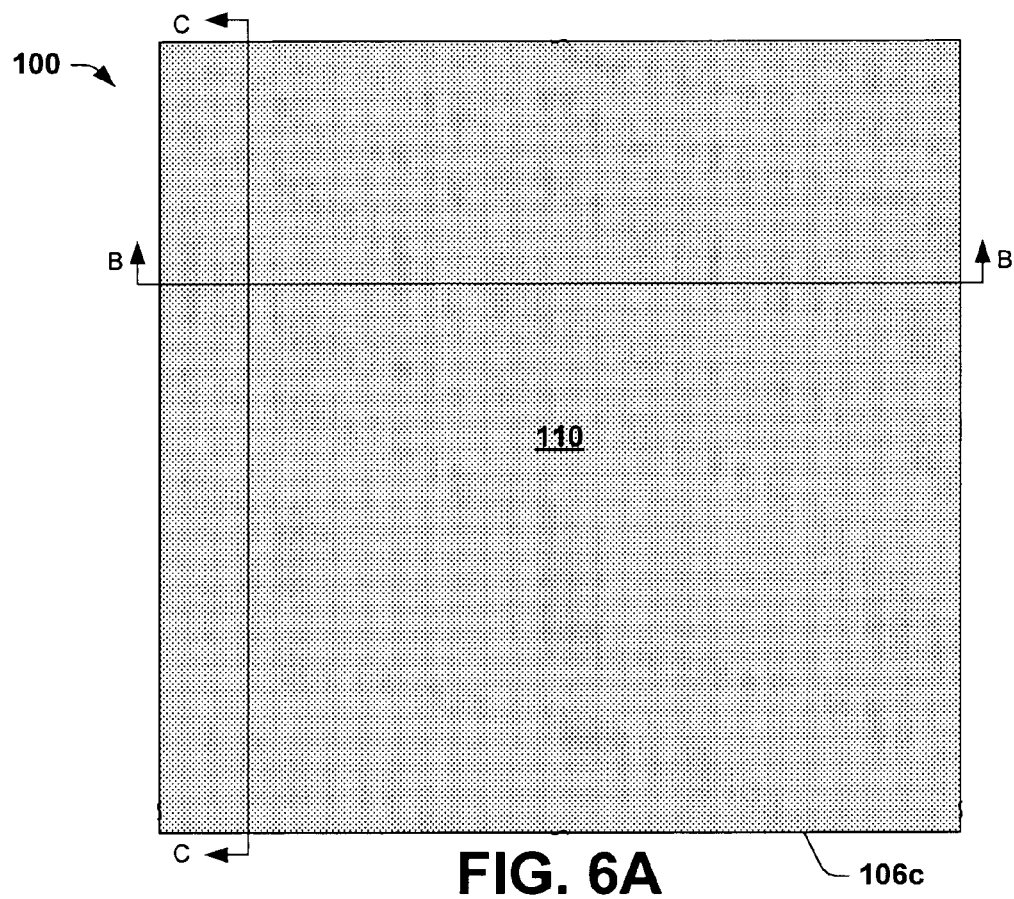
Figure 6B:
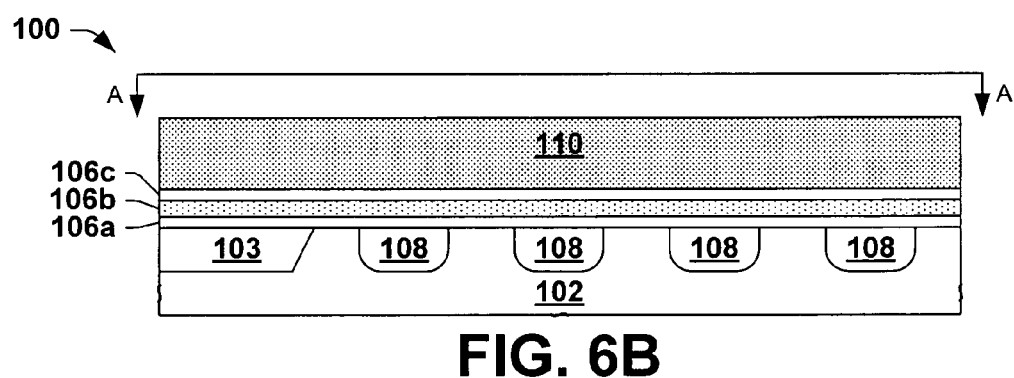
Figure 6C:
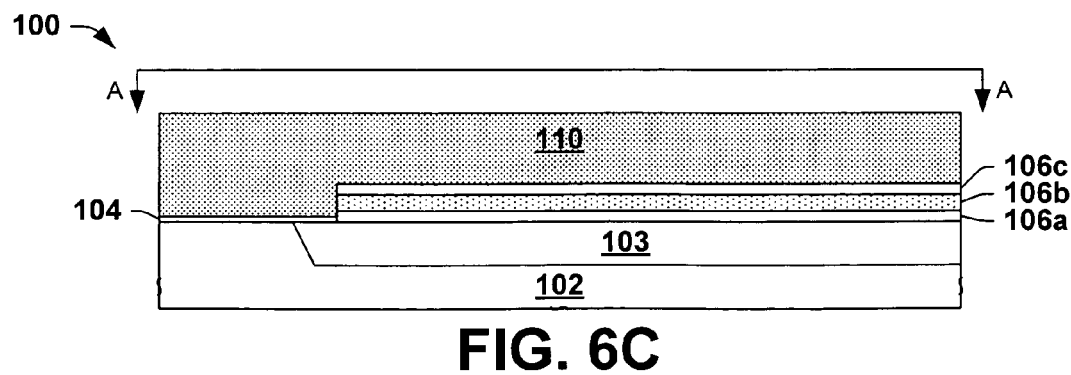
Figure 7A:
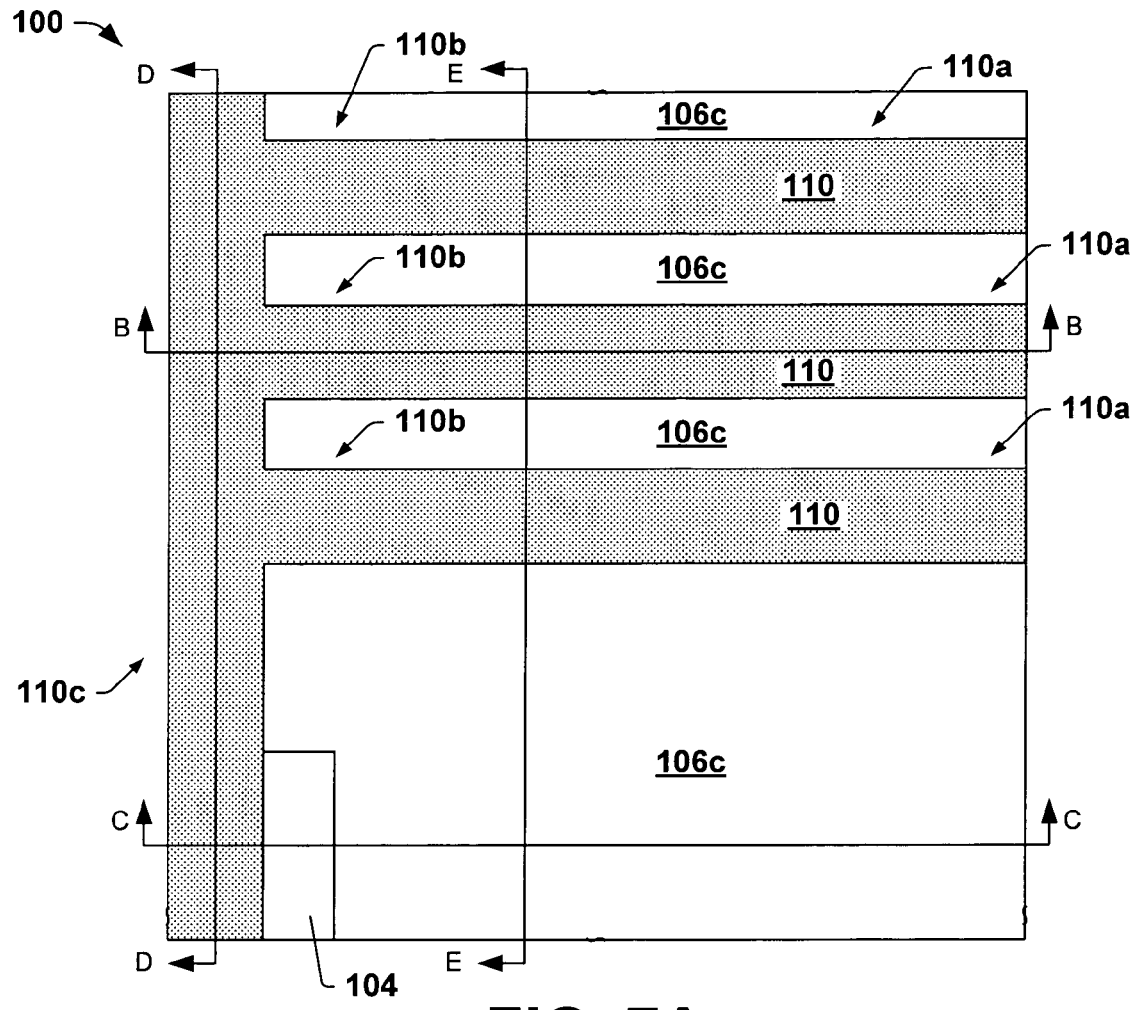
Figure 7B:
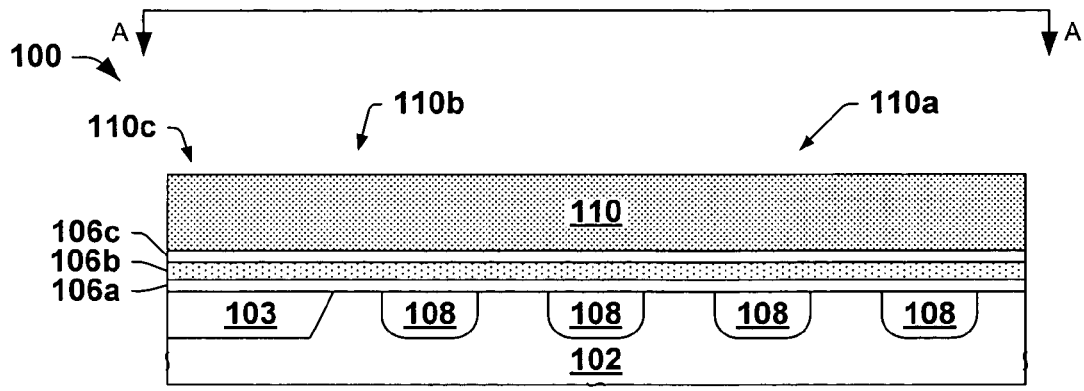
Figure 7C:
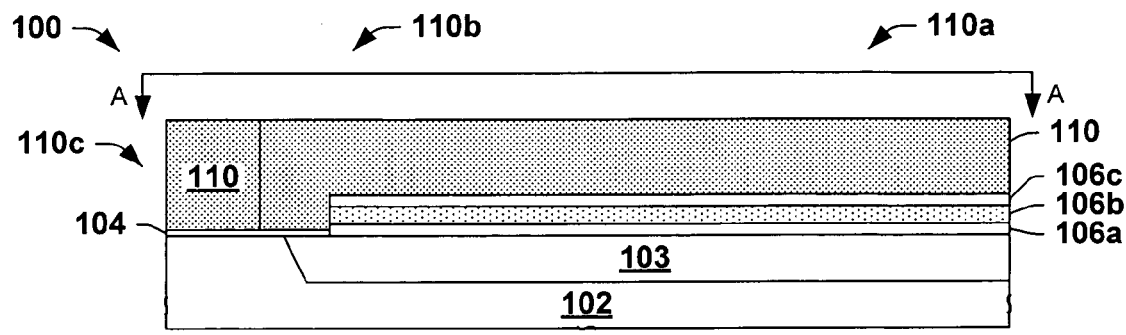
Figure 7D:
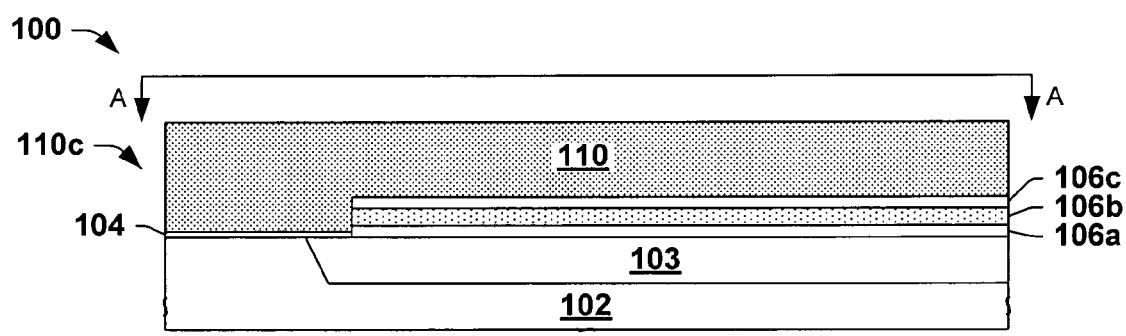
Figure 7E:
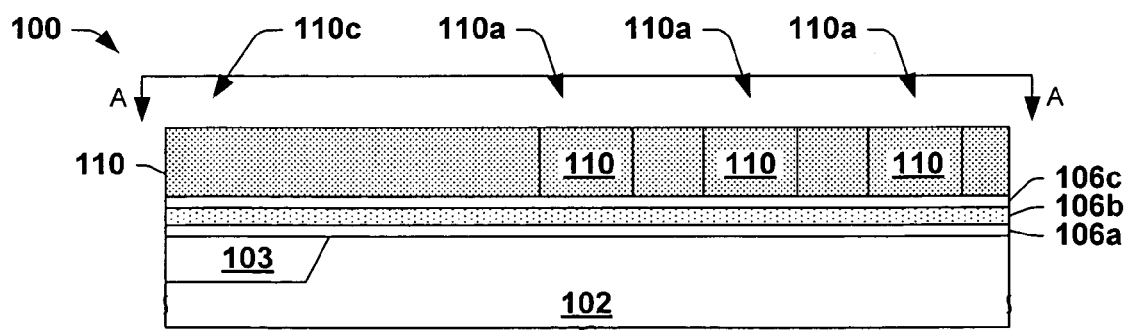
Figure 8A:
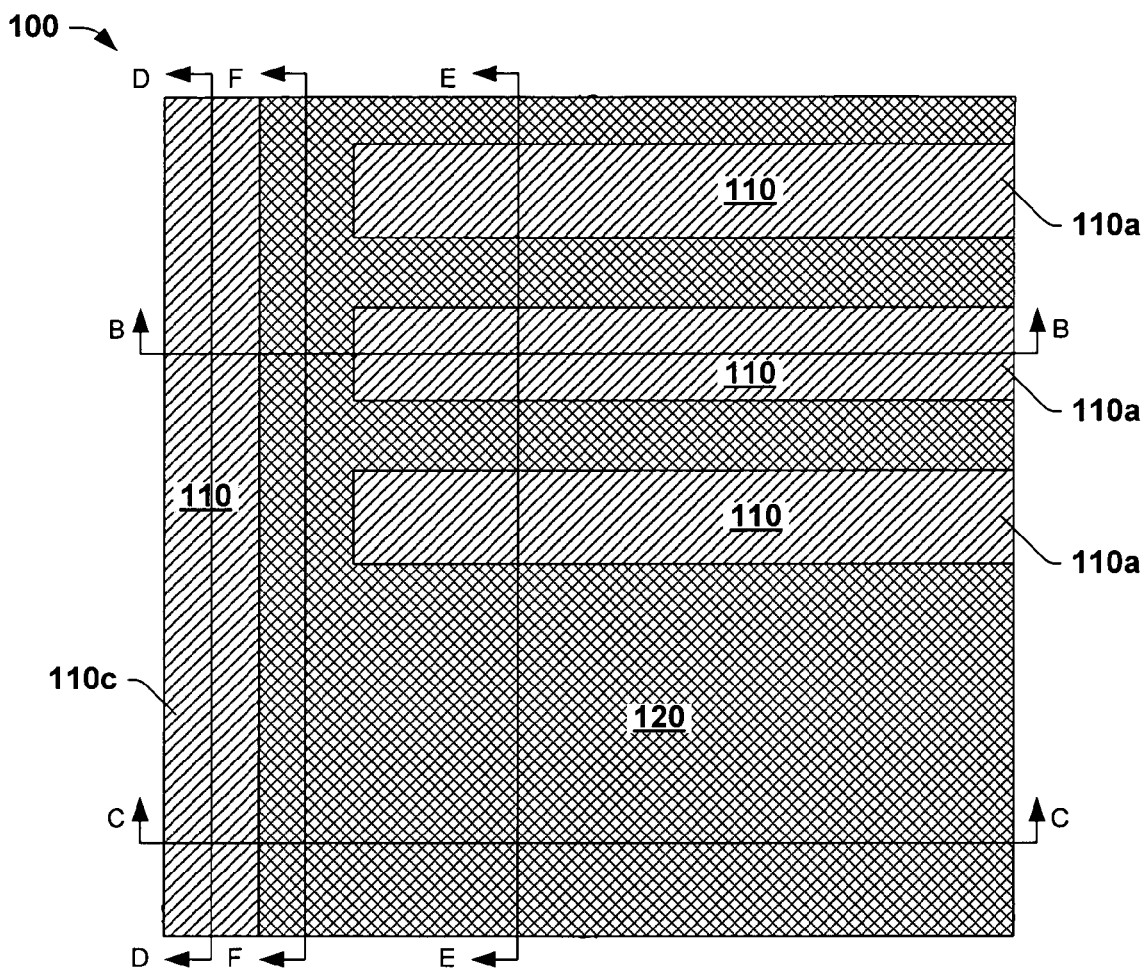
Figure 8B:
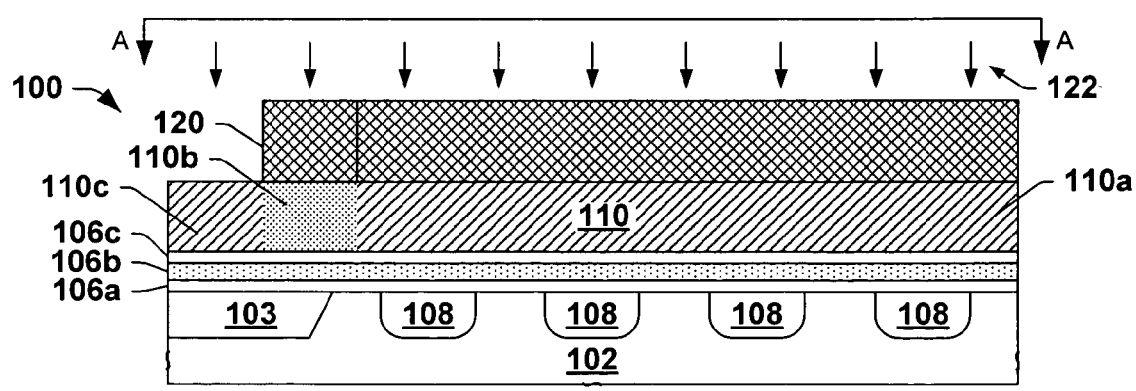
Figure 8C:
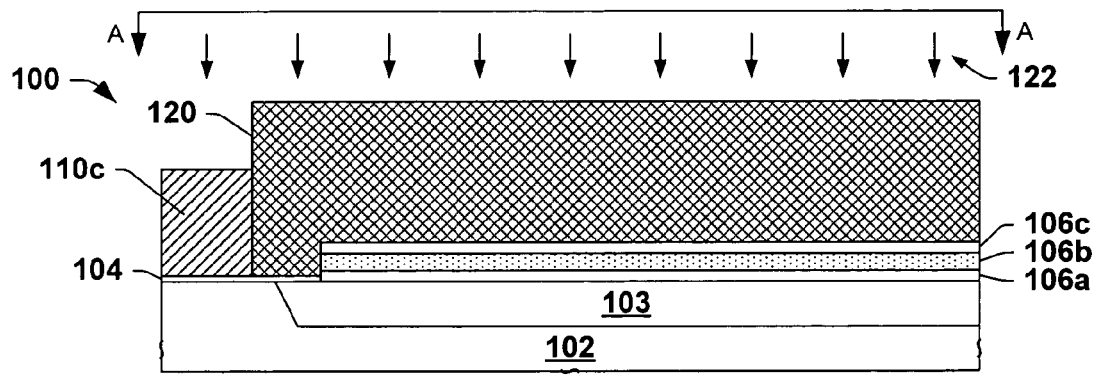
Figure 8D:
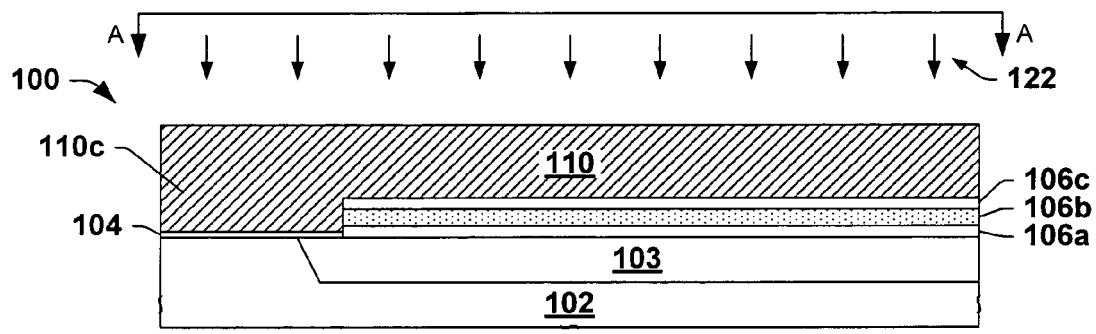
Figure 8E:
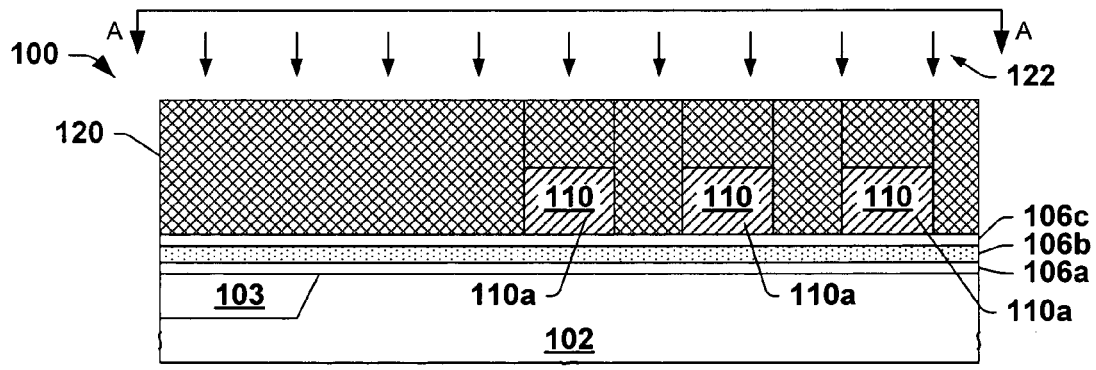
Figure 8F:
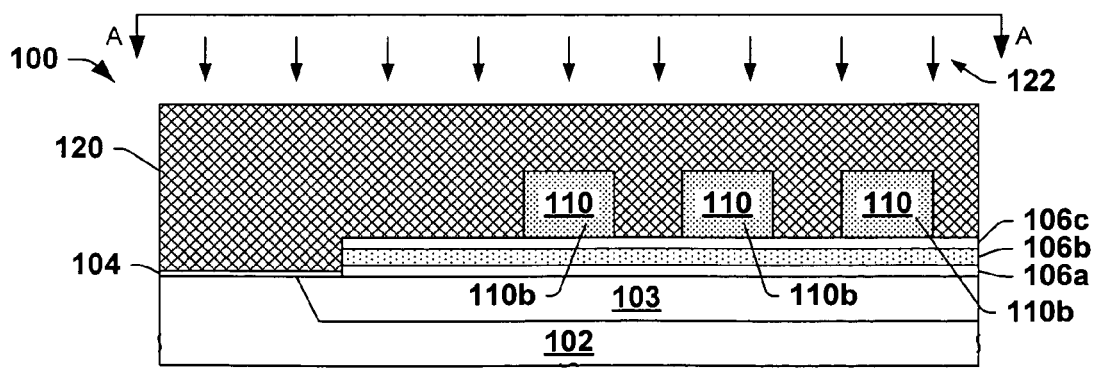
Figure 9A:
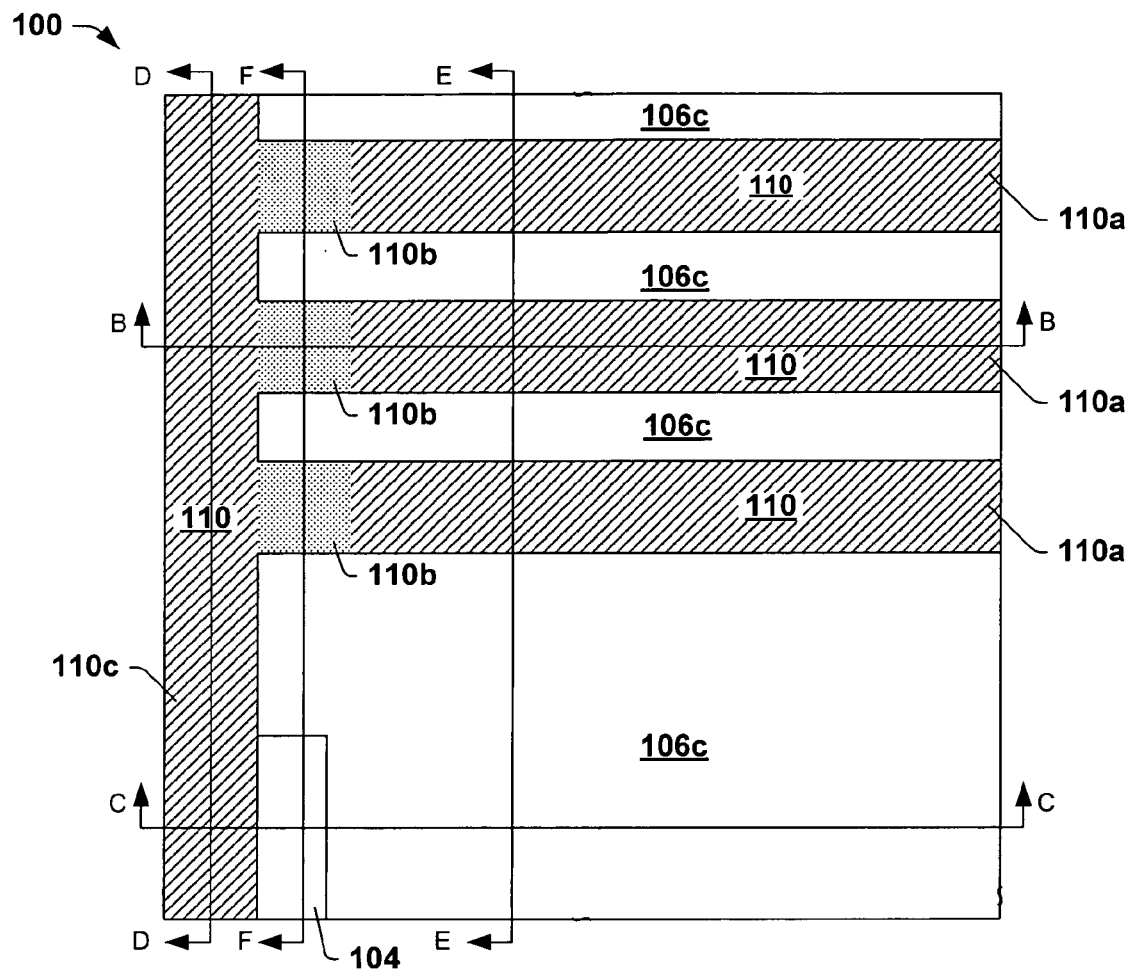
Figure 9B:
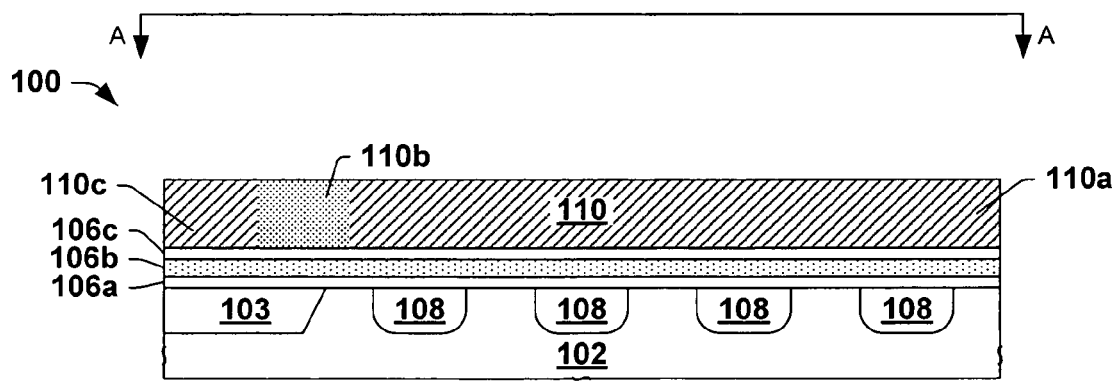
Figure 9C:
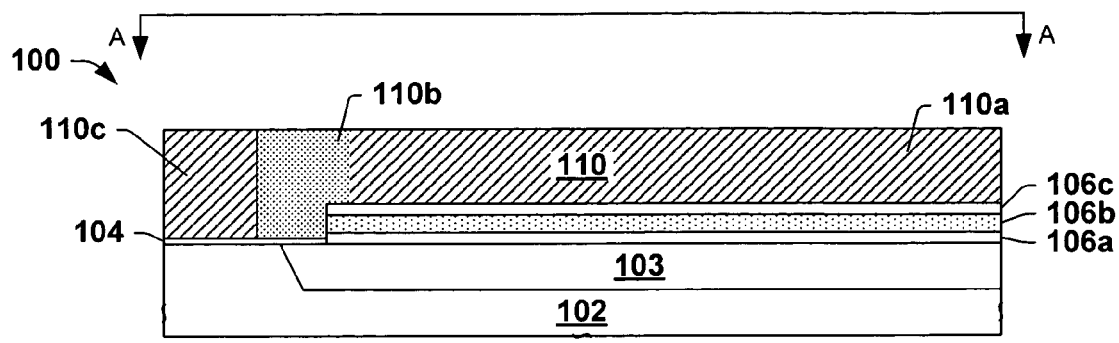
Figure 9D:
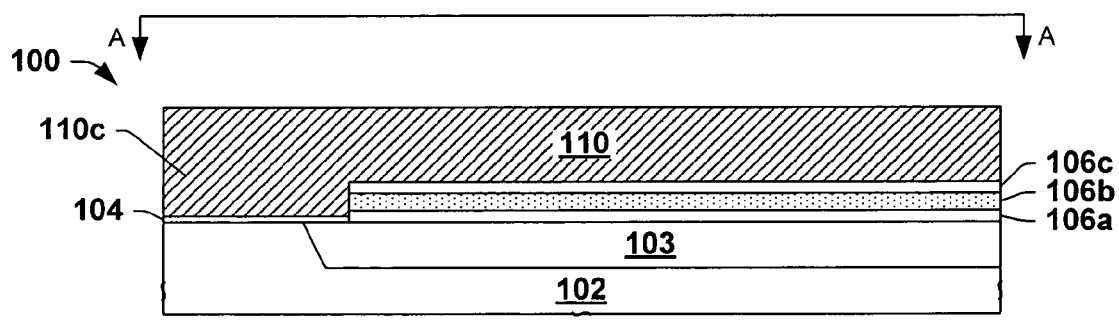
Figure 9E:
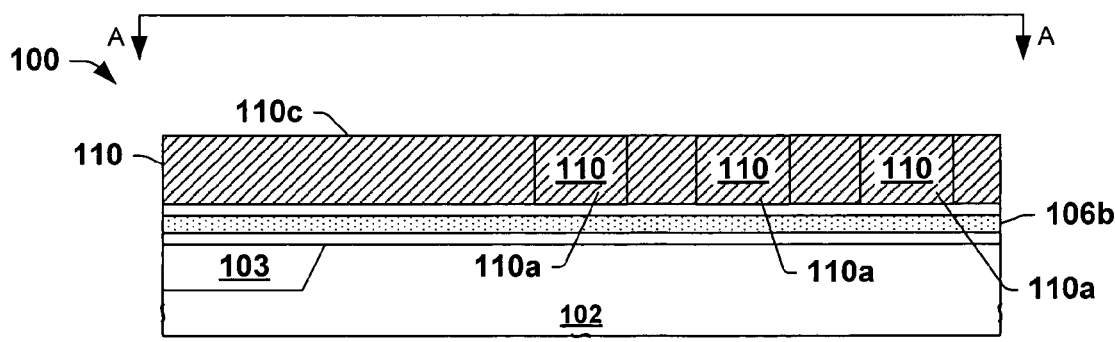
Figure 9F:
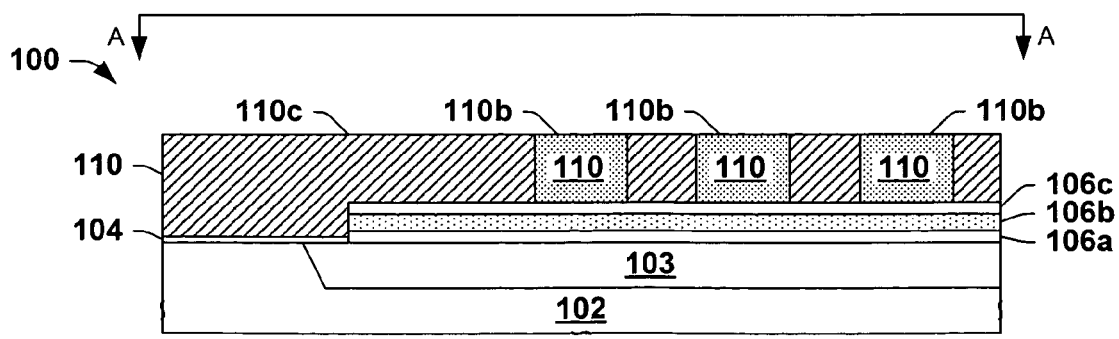
Figure 10A:
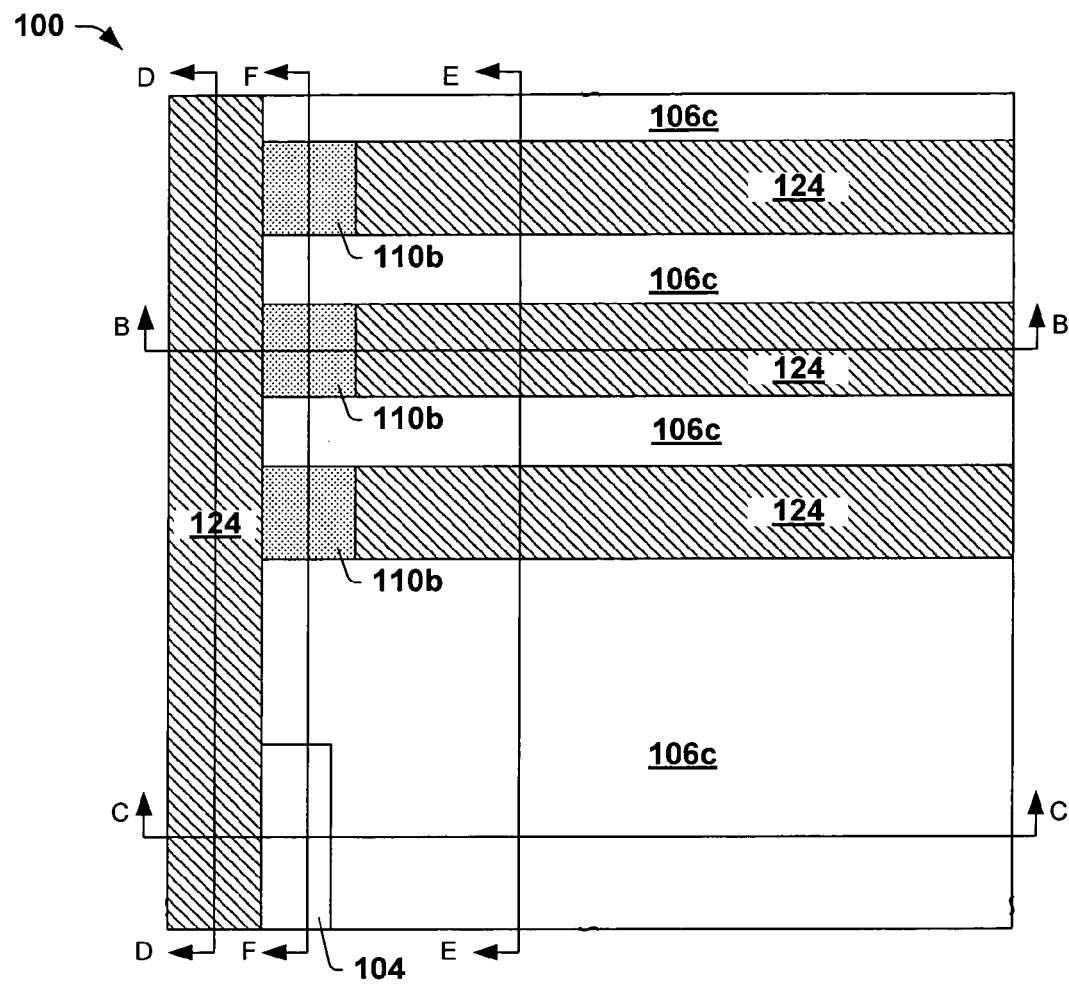
Figure 10B:
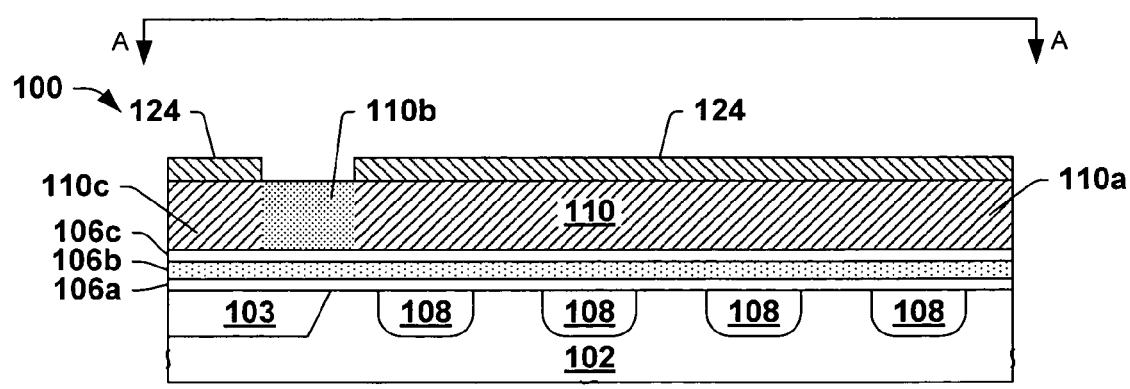
Figure 10C:
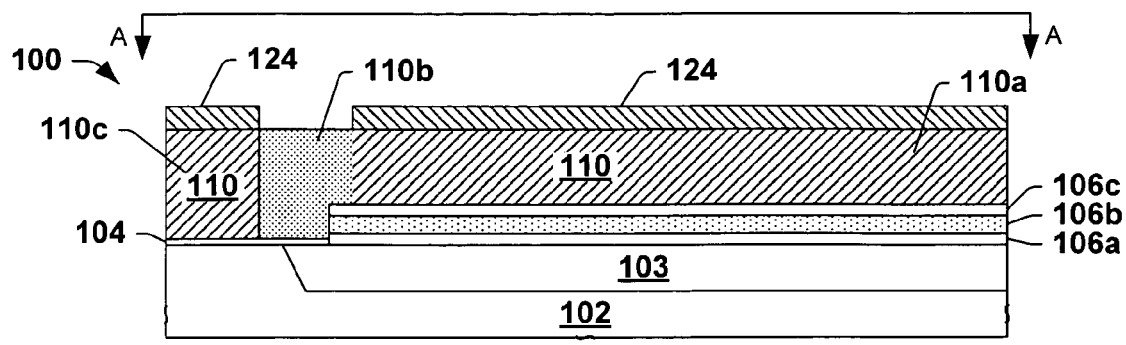
Figure 10D:
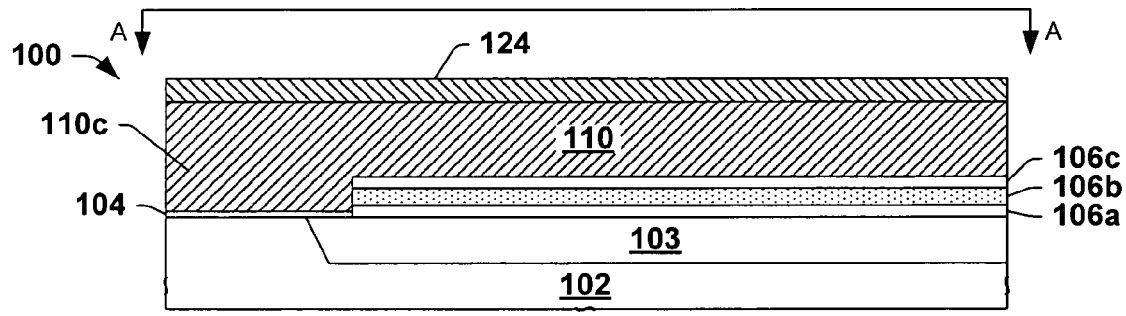
Figure 10E:
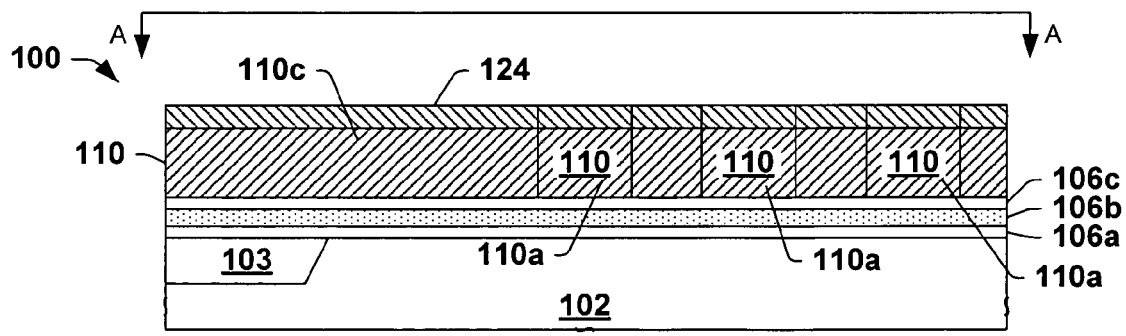
Figure 10F:
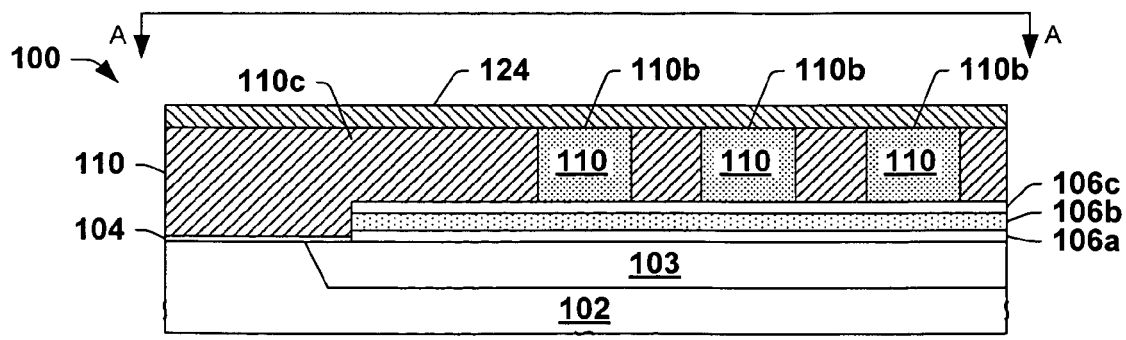
Figure 11A:
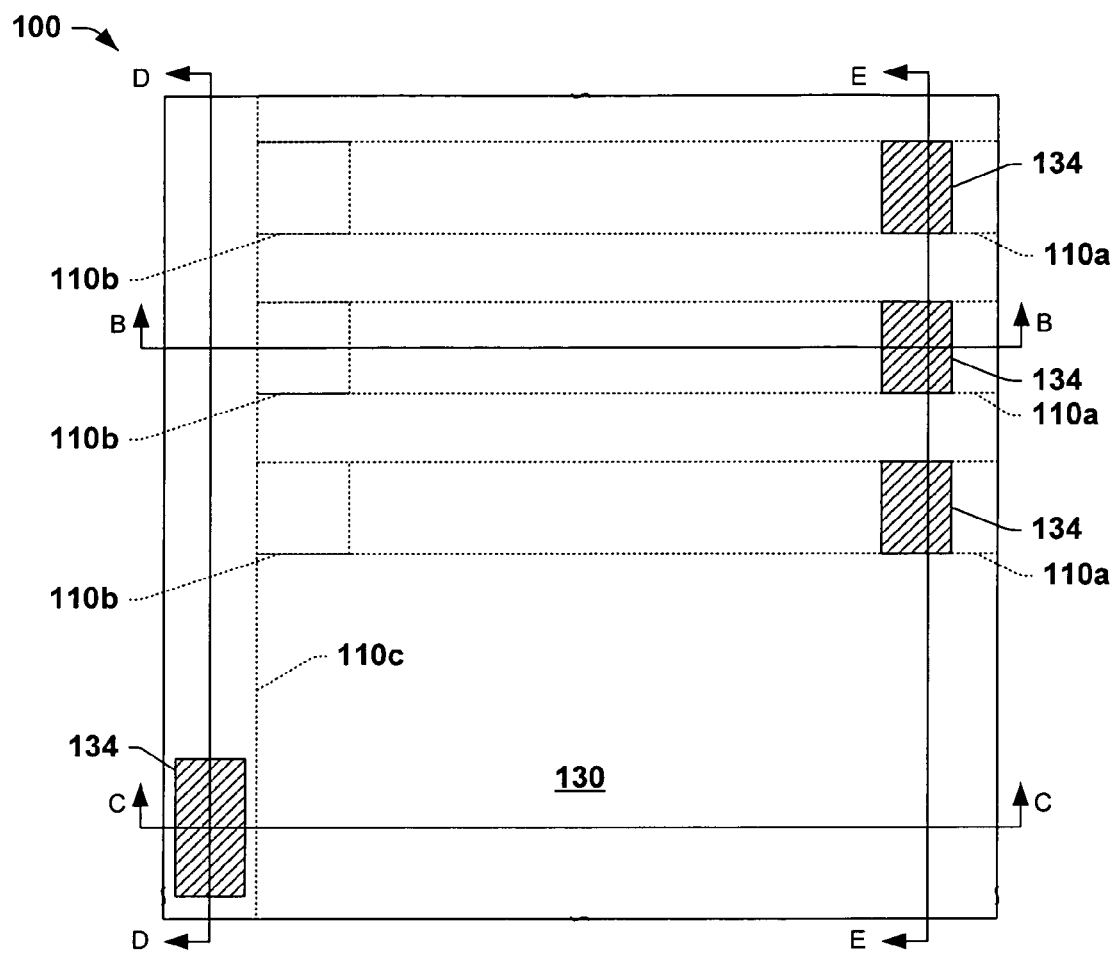
Figure 11B:
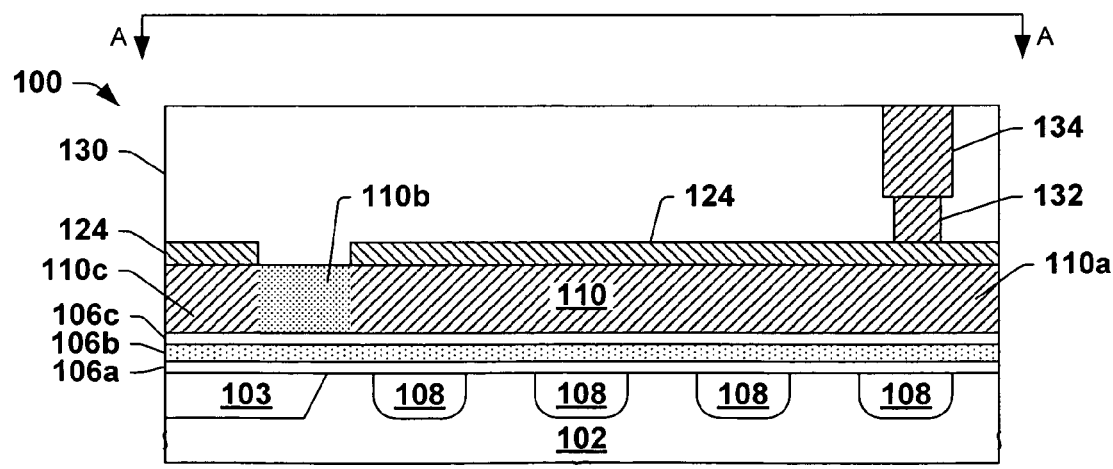
Figure 11C:
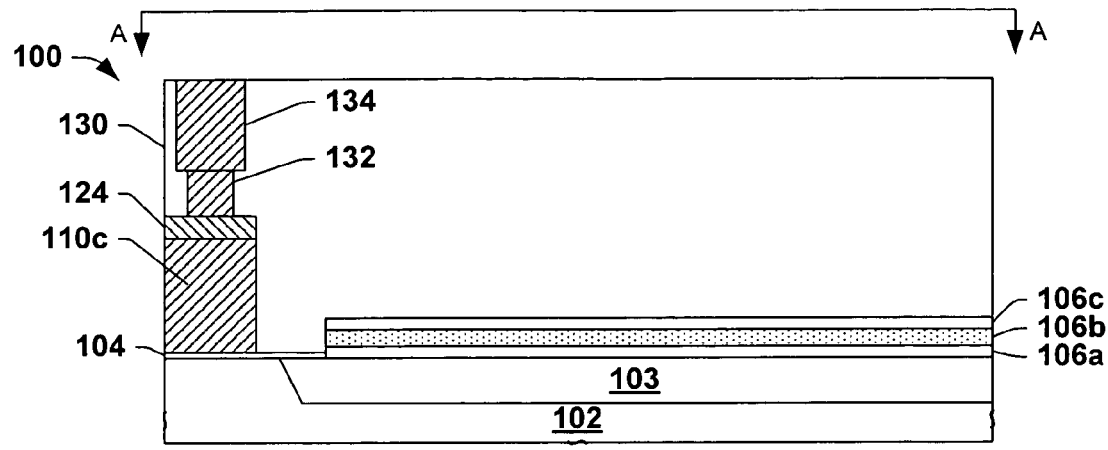
Figure 11D:
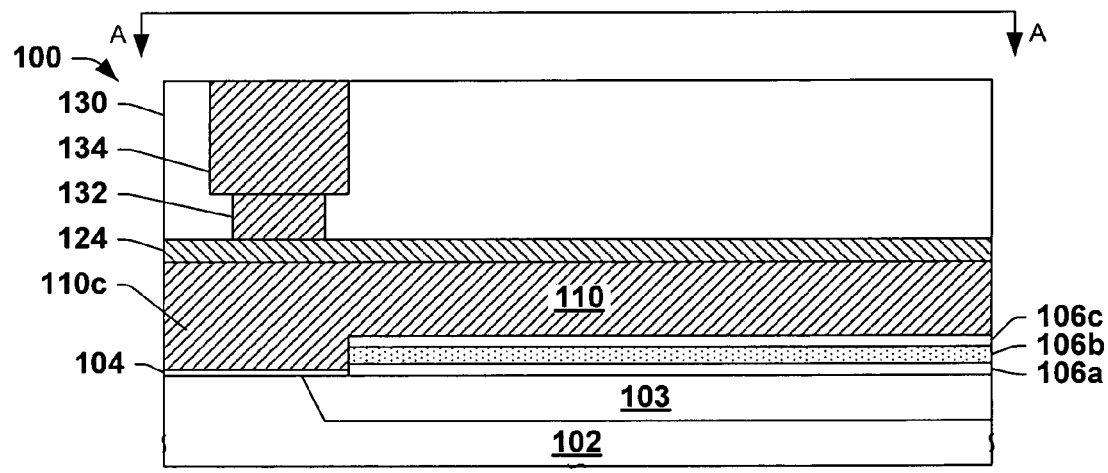
Figure 11E:
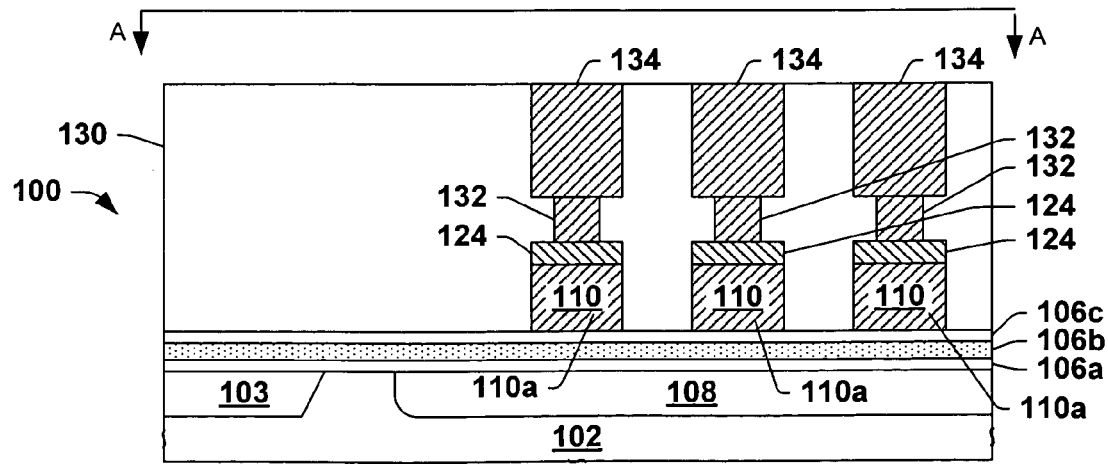

In FIGS. 6A–9F, a polysilicon structure is formed and selectively implanted to provide conductive wordlines and apparatus to protect the flash cells against process-related charging in accordance with an aspect of the invention. As shown in FIGS. 6A–6C, a layer of polysilicon 110 is deposited over the ONO layers 106 and over the exposed thin dielectric 104 to any suitable thickness. In FIGS. 7A–7E, the polysilicon 110 is patterned to define polysilicon wordline portions 110a over the floating gate or charge trapping material layers 106, a polysilicon discharge portion 110c spaced from the wordline portions 110a, and polysilicon resistor portions 110b between the wordline portions 110a and the discharge portion 110c. The patterned polysilicon wordline portions 110a extend along array rows generally perpendicular to the bitlines 108, and the resistor portions 110b extend outward from the row ends to the discharge portion 110c, which itself extends along the column direction in the illustrated example.

In FIGS. 8A–8F, an implant mask 120 is formed, covering the resistor portions 110b and exposing the wordline and discharge portions 110a and 110c, respectively. An ion implantation 122 is performed to selectively dope the exposed polysilicon portions 110a and 110c with n-type impurities, thereby rendering the wordline portions 110a and the discharge portion 110c conductive (e.g., substantially more conductive than the undoped resistor portions 110b) before the implantation mask 120 is removed, as seen in FIGS. 9A–9F. Since the resistor portions 110b are substantially undoped, they provide a resistance of about 1 Mohms or more in the path from the conductive wordline portions 110a to the discharge portion 110c. In FIGS. 10A–10F, a conductive metal silicide 124 is formed along the tops of the doped wordline portions 110a and the discharge portion 110c, where the resistor portions 110b are not silicided.

As illustrated in FIGS. 11A–11E, a first interconnect or metalization level is then constructed, comprising an interlevel dielectric ILD material 130 in which tungsten conductive contacts 132 and conductive copper or aluminum interconnect routing structures 134 are formed using damascene or other suitable metalization processing techniques. In the illustrated example, a contact 132 and a routing structure 134 are coupled to the silicide 124 over the discharge portion 110c, as well as to another contact (not shown in the figures) directly coupled to a silicide formed above the substrate 102, thereby providing another discharge path for currents caused by subsequent processing. Further metalization and other back-end processing are then performed to complete the device 100.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A method of fabricating a wordline structure for a flash memory cell, the method comprising:
   forming a conductive wordline structure above a floating gate or charge trapping material of at least one flash memory cell, where the word line structure is formed after one or more source/drain implantation processes have been performed to establish one or more conductive bitlines within a semiconductor substrate upon which the flash memory cell is formed; and
   forming a resistor concurrently with the conductive wordline structure and between the conductive wordline structure and the substrate, where the resistor is also formed after the one or more source/drain implantation processes have been performed.

2. The method of claim 1, wherein the resistor is formed prior to interconnect processing.

3. The method of claim 1, wherein forming the conductive wordline structure comprises forming doped polysilicon above the floating gate or charge trapping material, and wherein forming the resistor comprises forming substantially undoped polysilicon connected to the conductive wordline structure.

4. The method of claim 3, wherein forming the doped and substantially undoped polysilicon comprises:
   depositing a polysilicon layer;
   patterning the polysilicon layer to define a polysilicon wordline portion over the floating gate or charge trapping material and a polysilicon resistor portion connected to the polysilicon wordline portion; and
   doping the polysilicon wordline portion.

5. The method of claim 1, wherein forming the conductive wordline structure comprises forming a first doped polysilicon structure above the floating gate or charge trapping material, and wherein forming the resistor comprises forming a second doped polysilicon structure spaced from the first doped polysilicon structure and forming a substantially undoped polysilicon structure between the first and second doped polysilicon structures.

6. The method of claim 5, wherein forming the doped and substantially undoped polysilicon structures comprises:
   depositing a polysilicon layer;
   patterning the polysilicon layer to define a polysilicon wordline portion over the floating gate or charge trapping material, a polysilicon discharge portion spaced from the polysilicon wordline portion, and a polysilicon resistor portion between the polysilicon wordline portion and the polysilicon discharge portion; and
   doping the polysilicon wordline portion and the polysilicon discharge portion.

7. The method of claim 5, wherein the second doped polysilicon structure is formed over a thin dielectric above the substrate.

8. The method of claim 7, further comprising electrically coupling the second doped polysilicon structure to the substrate.

9. The method of claim 5, further comprising electrically coupling the second doped polysilicon structure to the substrate.

10. The method of claim 5, wherein the doped and substantially undoped polysilicon structures are formed concurrently.

11. The method of claim 5, wherein the doped and substantially undoped polysilicon structures are formed prior to interconnect processing.

12. The method of claim 1, wherein the resistor is electrically coupled between the conductive wordline structure and the substrate prior to interconnect processing.

13. A method of protecting wordline structures in a flash memory array, the method comprising:
   forming a plurality of polysilicon resistor structures individually coupled with a plurality of conductive wordlines in a memory array, where the resistor structures and wordlines are formed concurrently and after one or more source/drain implantation processes have been performed to establish one or more conductive bitlines within a semiconductor substrate upon which the flash memory array is formed; and coupling the plurality of polysilicon resistor structures to the substrate.

14. The method of claim 13, wherein forming the plurality of polysilicon resistor structures comprises:

depositing a polysilicon layer;

patterning the polysilicon layer to define a plurality of polysilicon wordline portions, a polysilicon discharge portion spaced from the polysilicon wordline portions, and a plurality of polysilicon resistor portions individually extending between the polysilicon discharge portion and the plurality of polysilicon wordline portions; and doping the polysilicon discharge portion and the plurality of polysilicon wordline portions.

15. The method of claim 13, wherein coupling the resistor structures to the substrate comprises forming a conductive discharge structure over a thin dielectric above the substrate and electrically coupling the discharge structure to the plurality of polysilicon resistor structures.

16. The method of claim 13, wherein coupling the resistor structures to the substrate comprises:

forming a conductive discharge structure;

electrically coupling the discharge structure to the plurality of polysilicon resistor structures; and electrically coupling the discharge structure to the substrate.

17. A method of protecting memory cells in a flash memory array, the method comprising:

performing one or more source/drain implantation processes to form a plurality of addressable bitlines of a memory array in a substrate;

concurrently forming a plurality of polysilicon resistor structures and a plurality of addressable wordlines of a memory array, wherein the resistor structures and addressable word lines are formed after the addressable bitlines have been formed; and coupling each addressable wordline to the substrate via an individual one of the polysilicon resistor structures.

18. The method of claim 17, wherein forming the plurality of polysilicon resistor structures and a plurality of addressable wordlines comprises:

depositing a polysilicon layer;

patterning the polysilicon layer to define a plurality of polysilicon wordline portions, a polysilicon discharge portion spaced from the polysilicon wordline portions, and a plurality of polysilicon resistor portions individually extending between the polysilicon discharge portion and the plurality of polysilicon wordline portions; and doping the polysilicon discharge portion and the plurality of polysilicon wordline portions.

* * * * *